(12) United States Patent
de Heer

(10) Patent No.: US 9,171,907 B2
(45) Date of Patent: Oct. 27, 2015

(54) GRAPHENE TRANSISTOR

(71) Applicant: Walt A. de Heer, Atlanta, GA (US)

(72) Inventor: Walt A. de Heer, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 14/345,093

(22) PCT Filed: Sep. 26, 2012

(86) PCT No.: PCT/US2012/057249
§ 371 (c)(1),
(2) Date: Mar. 14, 2014

(87) PCT Pub. No.: WO2013/049144
PCT Pub. Date: Apr. 4, 2013

(65) Prior Publication Data
US 2014/0361250 A1    Dec. 11, 2014

Related U.S. Application Data

(60) Provisional application No. 61/539,664, filed on Sep. 27, 2011.

(51) Int. Cl.
*H01L 29/76* (2006.01)
*H01L 29/16* (2006.01)
(Continued)

(52) U.S. Cl.
CPC ...... *H01L 29/1606* (2013.01); *H01L 21/02527* (2013.01); *H01L 21/02612* (2013.01);
(Continued)

(58) Field of Classification Search
CPC .............. H01L 29/1606; H01L 29/66015; H01L 2924/13088; H01L 29/66431; H01L 29/6647; H01L 29/78
USPC .......... 257/288, 368, 369; 438/151, 197, 199; 977/734, 742
See application file for complete search history.

(56) References Cited

U.S. PATENT DOCUMENTS 4,389,429 A    6/1983    Soclof
5,958,630 A    9/1999    Hashimoto et al.
(Continued)

FOREIGN PATENT DOCUMENTS

WO    03/018871 A2    3/2003

OTHER PUBLICATIONS

Bachtold et al.: "Logic Circuits with Carbon Nanotube Transistors" Science—Nov. 9, 2001—p. 1317—vol. 294.
(Continued)

*Primary Examiner* — Jarrett Stark
*Assistant Examiner* — Shahed Ahmed
(74) *Attorney, Agent, or Firm* — Bryan W. Bockhop; Bockhop & Associates, LLC

(57) ABSTRACT

A transistor includes a silicon carbide crystal (110) having a silicon terminated face (112). A semiconducting-type graphene layer (120) is bonded to the silicon terminated face (112). A first semimetallic-type graphene layer (122) is contiguous with a first portion of the semiconducting-type graphene layer (120). A second semimetallic-type graphene layer (122) is contiguous with a second portion of the semi-conducting-type graphene layer (120) that is spaced apart from the first portion. An insulator layer (132) is disposed on a portion of the semiconducting-type graphene layer (120). A gate conductive layer (134) disposed on the insulator layer (132) and spaced apart from the semiconducting-type graphene layer (120).

20 Claims, 2 Drawing Sheets

(51) Int. Cl.
| | |
|---|---|
| H01L 29/66 | (2006.01) |
| H01L 29/778 | (2006.01) |
| H01L 29/06 | (2006.01) |
| H01L 21/02 | (2006.01) |
| H01L 29/165 | (2006.01) |
| H01L 29/417 | (2006.01) |
| H01L 29/78 | (2006.01) |

(52) U.S. Cl.
CPC ...... *H01L21/02664* (2013.01); *H01L 29/0657* (2013.01); *H01L 29/165* (2013.01); *H01L 29/1608* (2013.01); *H01L 29/41758* (2013.01); *H01L 29/66431* (2013.01); *H01L 29/66477* (2013.01); *H01L 29/7781* (2013.01); *H01L 29/78* (2013.01)

(56) References Cited

U.S. PATENT DOCUMENTS

| | | | |
|---|---|---|---|
| 5,993,697 | A | 11/1999 | Cohen et al. |
| 6,133,587 | A | 10/2000 | Takeuchi et al. |
| 6,136,160 | A | 10/2000 | Hrkut et al. |
| 6,159,558 | A | 12/2000 | Wolfe et al. |
| 6,515,339 | B2 | 2/2003 | Shin et al. |
| 6,540,972 | B1 | 4/2003 | Hiura |
| 6,743,725 | B1 | 6/2004 | Hu et al. |
| 7,015,142 | B2 | 3/2006 | DeHeer et al. |
| 7,327,000 | B2 | 2/2008 | DeHeer et al. |
| 7,449,133 | B2 | 11/2008 | Gruner et al. |
| 7,732,859 | B2 | 6/2010 | Anderson et al. |
| 7,989,067 | B2 | 8/2011 | DeHeer et al. |
| 8,173,095 | B2 | 5/2012 | DeHeer et al. |
| 8,221,884 | B2 | 7/2012 | DeHeer et al. |
| 8,460,764 | B2 | 6/2013 | DeHeer et al. |
| 2002/0009637 | A1 | 1/2002 | Murakami et al. |
| 2002/0014667 | A1 | 2/2002 | Shin et al. |
| 2007/0092432 | A1 | 4/2007 | Prud'Homme et al. |
| 2008/0220620 | A1 | 9/2008 | Kawada et al. |
| 2009/0020764 | A1* | 1/2009 | Anderson et al. ............ 257/77 |
| 2009/0236608 | A1 | 9/2009 | de Heer et al. |
| 2010/0019250 | A1 | 1/2010 | Nakamura et al. |
| 2010/0062582 | A1 | 3/2010 | Fujikawa |
| 2010/0258787 | A1* | 10/2010 | Chae et al. ............ 257/39 |

OTHER PUBLICATIONS

Charrier et al.: "Solid-state Decomposition of Silicon Carbide for Growing Ultra-thin Heteroepitaxial Graphite Films" Journal of App Physics—Sep. 1, 2002—p. 2479—vol. 92.
Fuhrer et al.: "High-Mobility Nanotube Transistor Memory" Nano Letters—May 3, 2002—p. 755—vol. 2—No. 7.
Javey et al.: "Ballistic Carbon Nanotube Field-Effect Transistors" Nature—Aug. 7, 2003—p. 654—vol. 424.
Kempa et al.: "A Field-Effect-Transistor from Graphite" EPJ Manuscript—(believed to have been published Apr. 4, 2003).
Mintmire et al.: "Universal Density of States for Carbon Nanotubes" Physical Review Letters—Sep. 21, 1998—p. 2506—vol. 81—No. 12.
Nakada et al.: "Edge State in Graphene Ribbons" Physical Review B—Dec. 15, 1996—p. 17954—vol. 54—No. 24.
Poncharal et al.: "Room Temperature Ballistic Conduction in Carbon Nanotubes" J. Phys. Chem. B—Nov. 6, 2002—p. 12104.
Wakabayashi: "Electronic Transport Properties of Nanographite Ribbon Junctions" Physical Review B—Sep. 11, 2001—p. 125428-1—vol. 64.
Frank et al.: "Carbon Nanotube Quantum Resistors" Science—Jun. 12, 1998—p. 1744—vol. 280.
Berger et al.: "Ultrathin Epitaxial Graphite: 2D Electron Gas Properties and a Route toward Graphene-based Nanoelectroincs"; J. Phys. Chem. B 2004, pp. 19912-19916.
Wu et al.: "Graphenes as Potential Material for Electronics"; Chem. Rev. 2007, 107, p. 718.
International Search Authority: "Notification of Transmittal of the International Search Report and the Written Opinion of the International Searching Authority, or the Declaration" (PCT/US12/57249), Dec. 18, 2012.
Jones et al.: "Annealing ion implanted SiC with an AlN cap"; Materials Science and Engineering B61-62 (1999) p. 281.
Novoselov et al.: "Electric Field Effect in Atomically Thin Carbon Films" Science 306, 666 (2004).
Ohtani et al.: "Large High-Quality Silicon Carbide Single Crystal Substrates"; Nippon Steel Technical Report No. 84; 2001.
Shuman et al.: "Graphitization of Porous 6H—SiC Layers during Thermal Treatment in Vacuum"; Technical Physics Letters, vol. 30, No. 7; 2004; p. 572.

\* cited by examiner

GRAPHENE TRANSISTOR

CROSS-REFERENCE TO RELATED APPLICATION(S)

This application claims the benefit of U.S. Provisional Patent Application Ser. No. 61/539,664, filed Sep. 27, 2011, the entirety of which is hereby incorporated herein by reference.

This application claims the benefit of International Patent Application No. PCT/US12/57249, filed Sep. 26, 2012, the entirety of which is hereby incorporated herein by reference.

STATEMENT OF GOVERNMENT INTEREST

This invention was made with government support under agreement No. DMR-082382, awarded by the National Science Foundation. The government has certain rights in the invention.

BACKGROUND OF THE INVENTION

1. Field of the Invention

The present invention relates to graphitic devices and, more specifically, to a graphene transistor.

2. Description of the Related Art

Microelectronic circuits are fundamental to virtually all digital systems in existence. Current circuit technology employs semiconductor transistors that are coupled to each other with conductors, such as metal and polysilicon. Electrical current flowing through such conductors results in heat generation. A circuit density increases, heat generation becomes an increasingly significant problem.

One area currently being explored involves nano-scale carbon-based circuitry. For example, carbon nanotubes have the property of ballistic charge transport, in which when current flows through a nanotube almost no heat is generated. Unfortunately, because carbon nanotubes cannot currently be grown in a pattern corresponding to a desired practical scale circuit, use of carbon nanotube circuits are not currently seen as a viable solution.

Recently, graphene circuits have been proposed. Graphene is an allotrope of carbon that is only one atom thick. Graphene circuits employ a substantially flat graphene layer that has been patterned using conventional micro-electronic lithographic patterning techniques. The graphene can be patterned into channels with dimensions approximating the dimensions of carbon nanotubes, thereby achieving near-ballistic charge transport properties.

One difficulty currently experienced with graphene based electronics is that graphene behaves as a semimetal and not a semiconductor. As a result, most graphene transistors do not effectively function as switches due to large source to drain leakage currents. As a result, most attempts at making graphene transistors result in transistors that cannot be switched off. This problem has been approached by several different methods. In one method, very narrow graphene ribbons are produced which are often observed to have a band gap. In another method, attempts have been made to chemically functionalize graphene to give the functionalized regions of the graphene semiconductor properties. These approaches have not yet yielded graphene transistors that can be used in practical applications.

Therefore, there is a need for graphene-based transistors in which regions of the graphene have semiconducting properties. There is also a need for a method of making semiconducting graphene.

SUMMARY OF THE INVENTION

The disadvantages of the prior art are overcome by the present invention which, in one aspect, is a transistor that includes a silicon carbide crystal having a silicon terminated face. A semiconducting-type graphene layer is bonded to the silicon terminated face. A first semimetallic-type graphene layer is contiguous with a first portion of the semiconducting-type graphene layer. A second semimetallic-type graphene layer is contiguous with a second portion of the semiconducting-type graphene layer that is spaced apart from the first portion. An insulator layer is disposed on a portion of the semiconducting-type graphene layer. A gate conductive layer disposed on the insulator layer and spaced apart from the semiconducting-type graphene layer.

In another aspect, the invention is a method of making a transistor in which a semiconducting-type graphene layer is formed on a silicon terminated face of a silicon carbide crystal. At least one semimetallic-type graphene layer is formed adjacent to the silicon carbide crystal so that the semimetallic-type graphene layer is contiguous with the semiconducting-type graphene layer. An insulator layer is applied on a portion of the semiconducting layer. A conductor layer is applied to the insulator layer.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
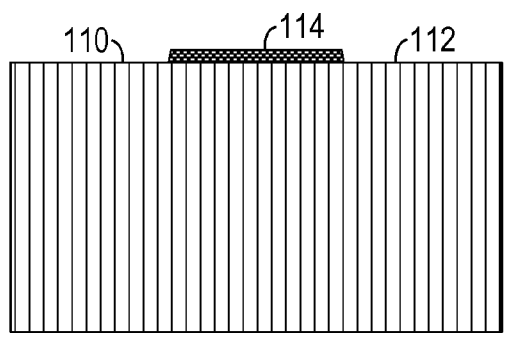
FIGS. 1A-1E are a schematic diagrams demonstrating a sidewall embodiment.
Figure 1B:
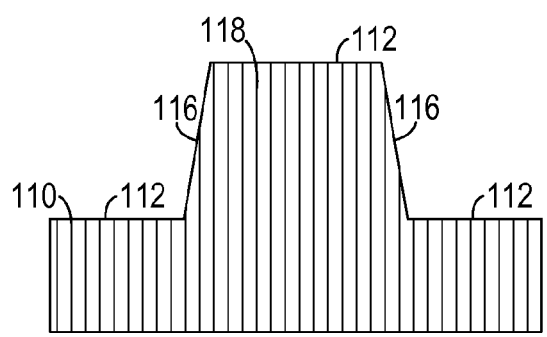

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Methods of making thin film graphene on silicon carbide crystals through annealing are shown in U.S. Pat. No. 7,015,142, and in U.S. Patent Publication No. US-2009-0226638-A1, both of which are incorporated herein by reference.

Figure 1C:
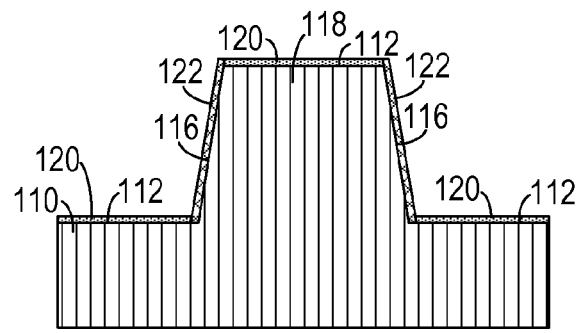

As shown in FIGS. 1A-1E, one embodiment of a transistor 100 is formed on a silicon terminated face 112 (e.g., the 0001 face) of a silicon carbide crystal 110. A mask 114 may be applied to the silicon terminated face 112, which is then subject to an etching process (e.g., oxygen plasma etching, chemical etching, ion beam etching, etc.) so as to form a raised portion 118 having opposing sidewalls 116. Because the sidewalls 116 are transverse to the silicon terminated face, they are not silicon terminated. As shown in FIG. 1C, the resulting crystal 110 is subjected to an annealing process (e.g., by heating it to a temperature of between 1000° C. and 2000° C. in a partial vacuum) that causes silicon atoms to evaporate from the crystal 110, leaving a layer 0-type graphene layer 120 (referred to as a "buffer layer") on the silicon terminated face 112 and a layer of 1-type graphene layer 122 on the sidewalls 116. The layer 0-type graphene layer 120 is contiguous with the layer 1-type graphene layer 122 and the junction between the two layers is seamless. Because the layer 0-type graphene layer 120 is bonded directly to the silicon terminated face 112 of the crystal 110, it exhibits the properties of a semiconductor such that it exhibits a band gap of about 0.3 eV-0.5 EV. Because the layer 1-type graphene layer 122 on the sidewalls 116 is not bonded to a silicon terminated face, it exhibits semimetallic properties and can act as a conductor. The top-most layers of graphene (whether layer 0-type or layer 1-type) will be contiguous and join seamlessly.

Figure 1D:
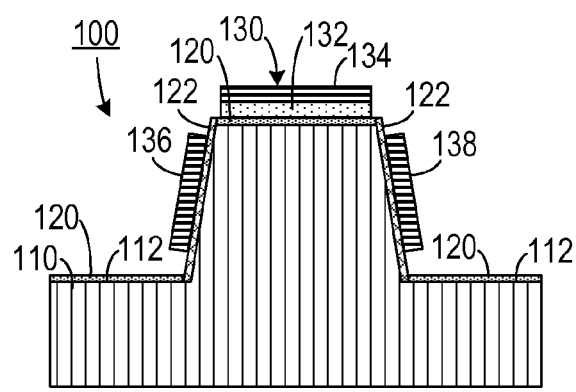
Figure 1E:
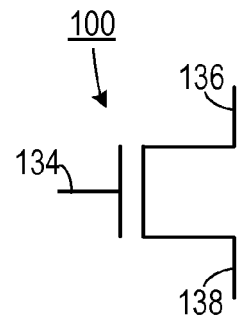

As shown in FIG. 1D, a dielectric insulator layer 132 is deposited on a top portion of the layer 0-type graphene layer 120 and a first conductor layer (e.g., a metal layer) 134 is deposited on the dielectric insulator layer 132. Together, these two layers form a gate 130. A second conductor layer 136 is deposited on one of the layer 1-type graphene layers 122 to form a source contact and a third conductor layer 138 is deposited on one of the layer 1-type graphene layers 122 to form a drain contact. This structure can be modeled as a transistor 100, as shown in FIG. 1E.

Figure 2A:
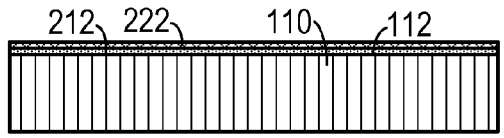
FIGS. 2A-2D are schematic diagrams demonstrating a flat embodiment.
Figure 2B:
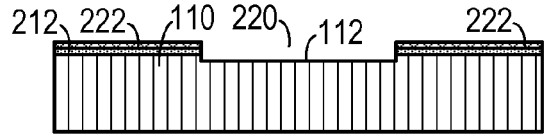
Figure 2C:
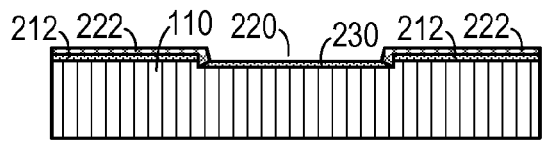
Figure 2D:
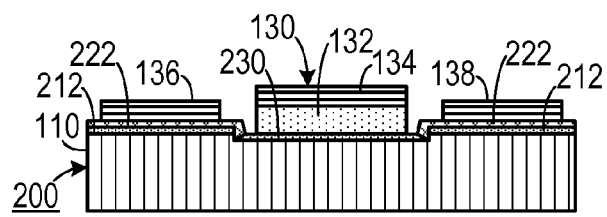

In another embodiment, as shown in FIGS. 2A-2D, at least two graphene layers are grown on the silicon terminated face 112 of a silicon carbide crystal 110 through a first annealing process in which silicon atoms are evaporated from the surface of the crystal 110. The graphene layers include a layer 0-type layer 212 that is bonded to the silicon terminated face 112 and at least one layer 1-type layer 222 that is bonded to the layer 0-type layer 212. As shown in FIG. 2B, an area 220 is etched into the two layers, thereby exposing a portion of the silicon terminated face 112 of the silicon carbide crystal 110. (In one example, an oxygen plasma etch is employed.) As shown in FIG. 2C, a second layer 0-type graphene layer 230 is then grown on the exposed portion of the silicon terminated face 112 through a second annealing process. This layer 0-type graphene layer 230 acts as a semiconductor, whereas the remaining layer 1-type graphene layers 222 have semimetallic conducting properties. A gate structure 130, as described above, is deposited on to the second layer 0-type graphene layer 230 and a source contact 136 and a drain contact 138 are deposited on to the layer 1-type graphene layers 222, as shown in FIG. 2D.

Figure 3A:
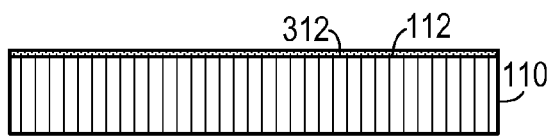
FIGS. 3A-3E are schematic diagrams demonstrating a passivated layer embodiment.
Figure 3B:
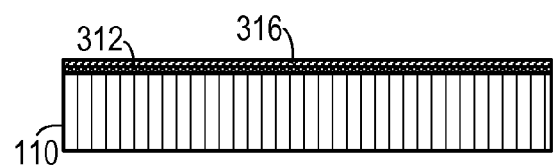
Figure 3C:
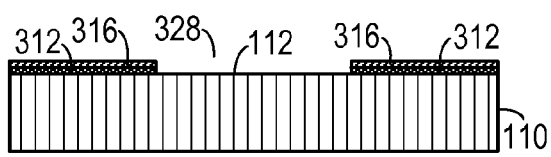
Figure 3D:
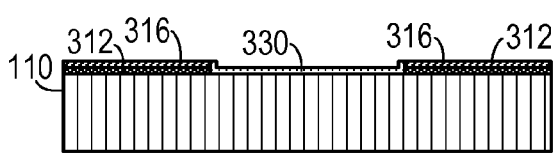
Figure 3E:
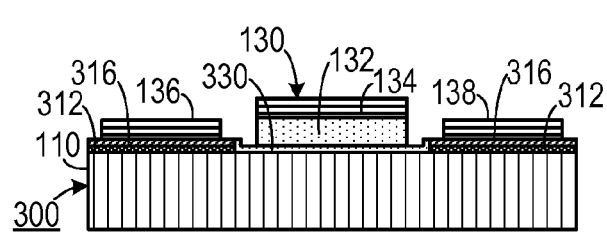

In yet another embodiment, as shown in FIGS. 3A-3E, a graphene buffer layer 312 is grown on a silicon terminated face 112 of a silicon carbide crystal 110. As shown in FIG. 3B, the surface 112 of the silicon carbide crystal 110 is passivated by subjecting it to a hydrogen gas environment, thereby forming a passivated silicon carbide surface 112. As a result, the bonds between the silicon carbide crystal 110 and the graphene layer 312 are broken and the graphene layer is now a layer 0*-type layer (which may be referred to as "passivated graphene"), which is quasi free standing and which acts as a semimetallic layer. In one experimental example, the hydrogen-rich environment included a one atmosphere partial pressure of hydrogen and the graphene layer 312 was heated to about 550° C. for about 75 minutes in the hydrogen-rich environment. As shown in FIG. 3C, an opening 328 is etched to expose a portion of the silicon terminated face 112. As shown in FIG. 3D, a second annealing results in a second layer 0-type graphene layer forming on the exposed portion of the silicon terminated face 112, which couples seamlessly to the layer 0*-type graphene layer 316. A gate structure 130, as described above, is deposited on to the layer 0-type graphene layer 330 and a source contact 136 and a drain contact 138 are deposited on to the layer 0*-type graphene layers 316, as shown in FIG. 3E. A portion of the layer 0*-type graphene layer 316 can be converted back to layer 0-type graphene by subjecting it to a hydrogen-poor environment (e.g., a partial vacuum) and heating it (e.g., to about 900° C.) for a predetermined amount of time.

The above embodiments may employ one of many known patterning processes to generate complex integrated circuits. When the sources and drains of the above disclosed transistors are subjected to a suitable bias voltage and when the gates are subjected to a gate voltage, the resulting field generated by the gate will cause current to flow through the semiconducting layer 0-type graphene subjected to the field. Thus, these transistors act as switches, thereby making them suitable for digital circuit applications.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A transistor, comprising:
   (a) a silicon carbide crystal having a silicon terminated face;
   (b) a semiconducting-type graphene layer bonded to the silicon terminated face;
   (c) a first semimetallic-type graphene layer contiguous with a first portion of the semiconducting-type graphene layer;
   (d) a second semimetallic-type graphene layer contiguous with a second portion of the semiconducting-type graphene layer that is spaced apart from the first portion;
   (e) an insulator layer disposed on a portion of the semiconducting-type graphene layer; and
   (f) a gate conductive layer disposed on the insulator layer and spaced apart from the semiconducting-type graphene layer.

2. The transistor of claim 1, wherein the semiconducting-type graphene layer comprises a layer 0-type graphene.

3. The transistor of claim 1, wherein at least one of the first semimetallic-type graphene layer and the second semimetallic-type graphene layer comprises a layer 1-type graphene.

4. The transistor of claim 1, wherein at least one of the first semimetallic-type graphene layer and the second semimetallic-type graphene layer is formed adjacent to a non-silicon terminated face of the silicon carbide crystal.

5. The transistor of claim 4, wherein the silicon terminated face comprises a horizontal surface of the silicon carbide crystal and wherein the non-silicon terminated face comprises a sidewall of the silicon carbide crystal.

6. The transistor of claim 1, wherein at least one of the first semimetallic-type graphene layer and the second semimetallic-type graphene layer is formed on a layer 0-type graphene layer.

7. The transistor of claim 1, wherein at least one of the first semimetallic-type graphene layer and the second semimetallic-type graphene layer comprises passivated graphene.

8. The transistor of claim 7, wherein passivated graphene is formed on passivated silicon carbide.

9. The transistor of claim 1, wherein the gate conductive layer comprises a metal.

10. The transistor of claim 1, further comprising:
   (a) a metal source contact affixed to the first semimetallic-type graphene layer; and
   (b) a metal drain contact affixed to the second semimetallic-type graphene layer.

11. A method of making a transistor, comprising the steps of:
   (a) forming a semiconducting-type graphene layer on a silicon terminated face of a silicon carbide crystal;
   (b) forming at least one semimetallic-type graphene layer adjacent to the silicon carbide crystal so that the semimetallic-type graphene layer is contiguous with the semiconducting-type graphene layer;
   (c) applying an insulator layer on a portion of the semiconducting layer; and
   (d) applying a conductor layer to the insulator layer.

12. The method of claim 11, wherein the step of forming a semiconducting-type graphene layer comprises evaporating silicon from the silicon carbide crystal.

13. The method of claim 11, further comprising the step of forming a raised portion on the silicon carbide crystal so that the raised portion has a silicon terminated face and at least one sidewall extending transversely therefrom so that the sidewall is not silicon terminated, wherein the semimetallic-type graphene is disposed on the sidewall.

14. The method of claim 11, wherein the step of forming at least one semimetallic-type graphene layer comprises forming a plurality of graphene layers on the silicon carbide crystal and wherein the step of forming a semiconducting-type graphene layer comprises removing a region of the plurality of graphene layers so as to expose an exposed silicon terminated face portion and then forming the semiconducting-type graphene layer on the exposed silicon terminated face portion.

15. The method of claim 11, wherein the step of forming a semimetallic-type graphene layer comprises the steps of:
   (a) evaporating silicon from a selected surface of the silicon carbide crystal thereby forming a graphene layer; and
   (b) passivating a portion of the selected surface of the silicon carbide crystal, thereby breaking chemical bonds between the portion of the selected surface and the silicon carbide crystal so that the selected surface becomes semimetallic-type graphene.

16. The method of claim 15, further comprising the step of forming a raised portion on the silicon carbide crystal so that the raised portion has a silicon terminated face and at least one sidewall extending transversely therefrom so that the sidewall is not silicon terminated.

17. The method of claim 15, wherein the step of passivating a portion of the selected surface of the silicon carbide crystal comprises the step of subjecting the selected surface to a hydrogen-rich environment at a preselected selected temperature for a preselected amount of time.

18. The method of claim 17, wherein the hydrogen-rich environment includes a one atmosphere partial pressure of hydrogen.

19. The method of claim 17, wherein the preselected temperature is about 550° C. and wherein the preselected amount of time is about 75 minutes.

20. The method of claim 17, further comprising the step of heating a selected portion of the semimetallic-type graphene in a hydrogen-poor environment at a temperature and for an amount of time sufficient to cause hydrogen to be removed from the selected portion, thereby causing the selected portion to become semiconducting.

\* \* \* \* \*